United States Patent
Zhao et al.

(10) Patent No.: US 12,463,110 B2
(45) Date of Patent: Nov. 4, 2025

(54) LAMINATE SUBSTRATE WITH EMBEDDED MULTI-LAYERED HEAT SLUG

(71) Applicant: Qorvo US, Inc., Greensboro, NC (US)

(72) Inventors: Bo Zhao, Allen, TX (US); Alex Arayata, McKinney, TX (US)

(73) Assignee: Qorvo US, Inc., Greensboro, NC (US)

(*) Notice: Subject to any disclaimer, the term of this patent is extended or adjusted under 35 U.S.C. 154(b) by 338 days.

(21) Appl. No.: 18/044,230

(22) PCT Filed: Sep. 29, 2021

(86) PCT No.: PCT/US2021/052531
§ 371 (c)(1),
(2) Date: Mar. 7, 2023

(87) PCT Pub. No.: WO2022/081335
PCT Pub. Date: Apr. 21, 2022

(65) Prior Publication Data
US 2023/0326829 A1    Oct. 12, 2023

Related U.S. Application Data

(60) Provisional application No. 63/091,122, filed on Oct. 13, 2020.

(51) Int. Cl.
*H01L 23/373*    (2006.01)
*H01L 23/367*    (2006.01)
(Continued)

(52) U.S. Cl.
CPC ...... *H01L 23/3735* (2013.01); *H01L 23/3677* (2013.01); *H05K 1/0204* (2013.01); *H05K 7/205* (2013.01)

(58) Field of Classification Search
CPC ............. H01L 23/3735; H01L 23/3736; H01L 23/373; H01L 23/3677; H01L 23/367;
(Continued)

(56) References Cited

U.S. PATENT DOCUMENTS

| 10,269,678 B1* | 4/2019 | Viswanathan ...... H01L 21/4867 |
| 2009/0002950 A1* | 1/2009 | Gertiser ................. H05K 7/205 |
| | | 361/709 |

(Continued)

FOREIGN PATENT DOCUMENTS

| EP | 3496140 A1 | 6/2019 |
| WO | 2019191457 A1 | 10/2019 |

OTHER PUBLICATIONS

International Search Report and Written Opinion for International Patent Application No. PCT/US2021/052531, mailed Jan. 31, 2022, 13 pages.

*Primary Examiner* — Adam B Dravininkas
(74) *Attorney, Agent, or Firm* — Withrow & Terranova, P.L.L.C.

(57) ABSTRACT

The disclosure is directed to an electronic device with an embedded multi-layered heat slug. The electronic device in includes a substrate having a substrate body with a laminate layer. The substrate further includes a heat slug embedded within the substrate body. The heat slug includes a top layer having a first thermal conductivity and a first thermal expansion coefficient, a bottom layer having a second thermal conductivity and a second thermal expansion coefficient, and a core layer having a third thermal conductivity and a third thermal expansion coefficient. The third thermal conductivity is less than the first thermal conductivity and the second thermal conductivity, and the third thermal expansion coefficient is less than the first thermal expansion coefficient and the second thermal expansion coefficient. In certain embodiments, the top layer and the bottom layer comprise copper, and the core layer comprises copper-molybdenum.

18 Claims, 4 Drawing Sheets

(51) Int. Cl.
*H05K 1/02* (2006.01)
*H05K 7/20* (2006.01)

(58) Field of Classification Search
CPC .... H05K 1/0204; H05K 1/0207; H05K 1/021; H05K 7/205; H05K 3/4602; H05K 1/09; H05K 2201/096
See application file for complete search history.

(56) References Cited

U.S. PATENT DOCUMENTS

| | | | |
|---|---|---|---|
| 2013/0082775 A1* | 4/2013 | Matsumoto | H03F 3/211 330/149 |
| 2015/0228554 A1* | 8/2015 | Rollin | H01L 23/562 257/664 |
| 2019/0102498 A1* | 4/2019 | Flowers | H01L 24/06 |
| 2019/0148138 A1* | 5/2019 | Molla | H01L 23/36 257/706 |
| 2020/0008327 A1* | 1/2020 | Lear | H05K 9/0037 |
| 2020/0294884 A1* | 9/2020 | Shaikh | H01L 23/38 |
| 2022/0052667 A1* | 2/2022 | Carpenter | H01L 23/552 |

\* cited by examiner

W=30.5um

W=23.1um

LAMINATE SUBSTRATE WITH EMBEDDED MULTI-LAYERED HEAT SLUG

RELATED APPLICATIONS

This application is a 35 USC 371 national phase filing of International Application No. PCT/US2021/052531, filed Sep. 29, 2021, which claims the benefit of U.S. Provisional Patent Application Ser. No. 63/091,122, filed Oct. 13, 2020, the disclosures of which are incorporated herein by reference in their entireties.

FIELD OF THE DISCLOSURE

The present invention relates to packaging of integrated circuits (ICs). In particular, the present invention relates to a laminate substrate with an embedded multi-layered heat slug.

BACKGROUND

Field-Effect transistors (FETs) are types of transistors used to control flow of current in a semiconductor. Gallium Nitride (GaN) high-electron-mobility transistors (HEMT) are a type of FET that can switch faster than silicon power transistors. In particular, compared to other semiconductor technologies, GaN HEMT on a silicon carbide (SiC) substrate offers high breakdown voltages, high power density, high efficiency, and high transition frequency. Further, internal matched FET transistor (IMFET) GaN power amplifiers facilitate manufacture, and provide high power, high efficiency, high integration, and are easy to use.

High power IMFET GaN power amplifiers require high thermal dissipation to keep the GaN HEMT transistor junction temperature low, such as to preserve the lifetime of the transistors, and thereby the device. Typically, ceramic packages with a metallic base are used to provide thermal dissipation. However, such ceramic packages generally require a cutout in the PCB and a heatsink for the package to sit in. Accordingly, PCB design and assembly is complicated and expensive.

SUMMARY

The disclosure is directed to an electronic device with an embedded multi-layered heat slug. The electronic device includes a substrate having a substrate body with a laminate layer. The substrate further includes a heat slug embedded within the substrate body. The heat slug includes a top layer having a first thermal conductivity and a first thermal expansion coefficient, a bottom layer having a second thermal conductivity and a second thermal expansion coefficient, and a core layer having a third thermal conductivity and a third thermal expansion coefficient. The third thermal conductivity is less than the first thermal conductivity and the second thermal conductivity, and the third thermal expansion coefficient is less than the first thermal expansion coefficient and the second thermal expansion coefficient. In certain embodiments, the top layer and the bottom layer comprise copper, and the core layer comprises copper-molybdenum.

One embodiment of the disclosure relates to an electronic device. The electronic device includes a substrate including a substrate body having a top surface and a bottom surface opposite the top surface. The substrate body includes a laminate layer. The substrate body further includes a heat slug extending between the top surface and the bottom surface of the substrate body. The heat slug includes a top layer proximate the top surface of the substrate body. The top layer has a first thermal conductivity and a first thermal expansion coefficient. The heat slug includes a bottom layer proximate the bottom surface of the substrate body. The bottom layer has a second thermal conductivity and a second thermal expansion coefficient. The heat slug includes a core layer between the top layer and the bottom layer. The core layer has a third thermal conductivity and a third thermal expansion coefficient. The third thermal conductivity is less than the first thermal conductivity and the second thermal conductivity. The third thermal expansion coefficient is less than the first thermal expansion coefficient and the second thermal expansion coefficient.

Another embodiment of the disclosure relates to an electronic device, including a substrate including a substrate body having a top surface and a bottom surface opposite the top surface. The substrate body has a laminate layer. The substrate further includes a heat slug extending between the top surface and the bottom surface of the substrate body. The heat slug includes a top layer comprising copper and devoid of molybdenum. The top layer is proximate the top surface of the substrate body. The heat slug further includes a bottom layer comprising copper and devoid of molybdenum. The bottom layer is proximate the bottom surface of the substrate body. The heat slug further includes a core layer comprising copper and molybdenum. The core layer is between the top layer and the bottom layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

Figure 1:
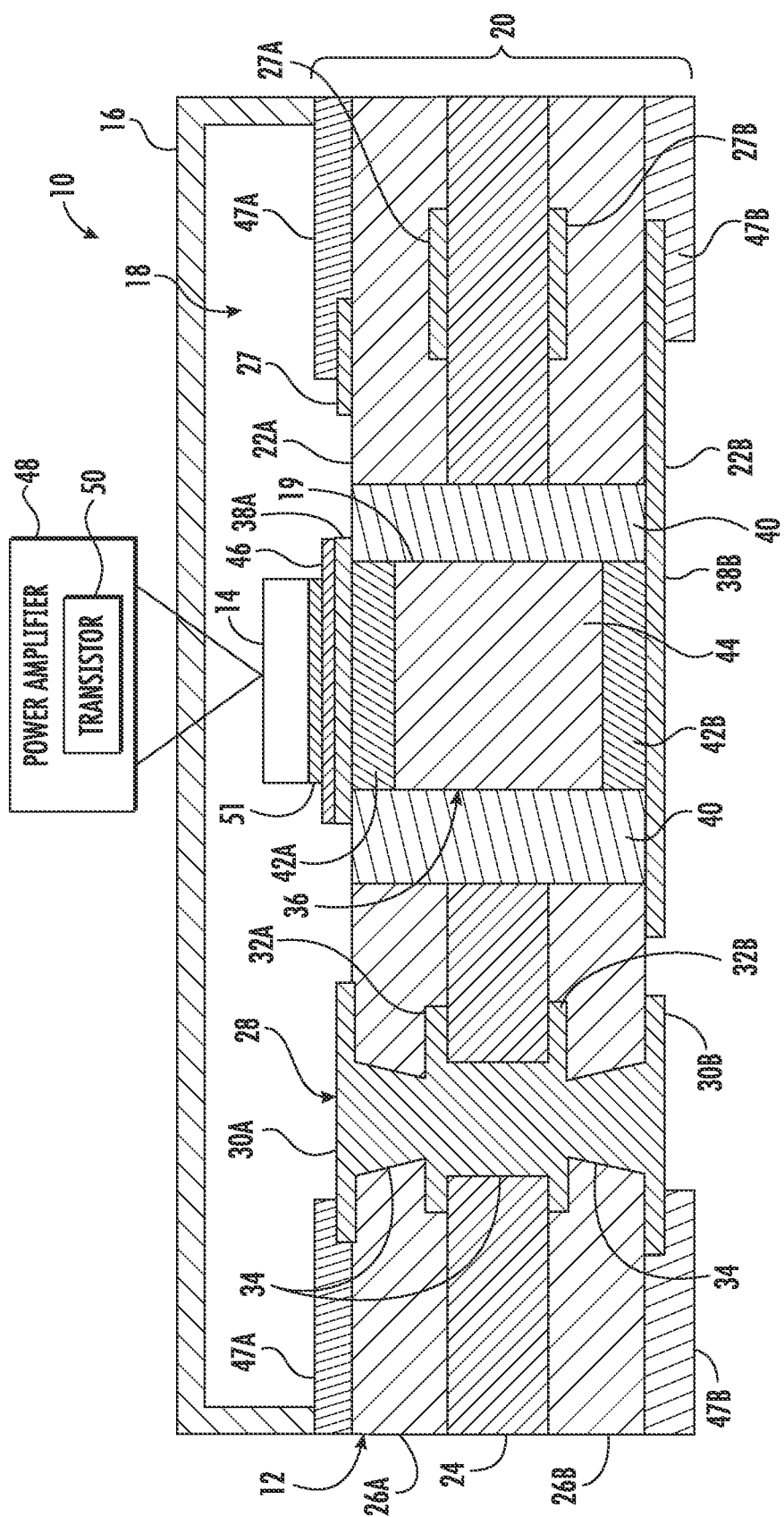
FIG. 1 is a cross-sectional side view of an electronic device illustrating a laminate substrate with a multi-layered heat slug.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element, and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

The disclosure is directed to an electronic device with an embedded multi-layered heat slug. The electronic device includes a substrate having a substrate body with a laminate layer. The substrate further includes a heat slug embedded within the substrate body. The heat slug includes a top layer having a first thermal conductivity and a first thermal expansion coefficient, a bottom layer having a second thermal conductivity and a second thermal expansion coefficient, and a core layer having a third thermal conductivity and a third thermal expansion coefficient. The third thermal conductivity is less than the first thermal conductivity and the second thermal conductivity, and the third thermal expansion coefficient is less than the first thermal expansion coefficient and the second thermal expansion coefficient. In certain embodiments, the top layer and the bottom layer comprise copper, and the core layer comprises copper-molybdenum.

FIG. 1 is a cross-sectional side view of an electronic device 10 including a laminate substrate 12 (may also be referred to as a substrate), an electronic component 14 mounted to the substrate 12, and a lid 16 mounted to the laminate substrate 12. The substrate 12 and the lid 16 define an air cavity 18 therebetween, with the electronic component 14 positioned within the air cavity 18.

The substrate 12 includes a substrate body 20 having a top surface 22A and a bottom surface 22B opposite the top surface 22A. The substrate body 20 includes a laminate layer 24 (may also be referred to as a core layer), an upper dielectric layer 26A, and a lower dielectric layer 26B. The laminate layer 24 is positioned between the upper dielectric layer 26A and the lower dielectric layer 26B. In certain embodiments, the laminate layer comprises a glass-reinforced epoxy laminate material (e.g., FR-4 composite material).

The substrate body 20 further includes a plurality of routing layers 27A, 27B between the laminate layer 24 and the dielectric layers 26A, 26B. For example, the substrate body 20 includes a laminate layer 24, two dielectric layers 26A, 26B, and routing layers 27A, 27B between the laminate layer 24 and the dielectric layers 26A, 26B, at the top and bottom of the substrate body 20. In certain embodiments, the substrate body 20 may include more laminate layers 24, dielectric layers 26A, 26B, and/or routing layers 27A, 27B.

The substrate body 20 further includes a substrate via structure 28 extending through the substrate body 20 from the top surface 22A to the bottom 22B. In certain embodiments, the substrate body 20 may include more substrate via structures 28. The substrate via structure 28 may include a top via pad 30A that resides over the top surface 22A of the substrate body 20, a bottom via pad 30B that resides over the bottom surface 22B of the substrate body 20, multiple inner via layers 32A, 32B integrated in the substrate body 20, including upper inner via layer 32A and lower inner via layer 32B. The substrate body 20 further includes a number of via connections 34 coupling the top via pad 30A, the inner via layers 32A, 32B, and the bottom via pad 30B. In some applications, the substrate via structure 28 may not include the inner via layers 32A, 32B, such that the via connections 34 are directly connecting the top via pad 30A and the bottom via pad 30B. The top via pad 30A, the bottom via pad 30B, and the inner via layers 32A, 32B may be formed of metallic materials (such as copper), and the via connections 34 may be formed as via holes, within which electrically conductive materials (such as copper) are filled or plated. The via connections 34 may also be realized by plating inner walls of the via holes with an electrically conductive material (such as copper), then filling the via holes with non-conductive materials such as epoxy resin.

The substrate 12 further includes a thermal conducting component 36 positioned within the substrate body 20 and extending between the top surface 22A and the bottom surface 22B of the substrate body 20. In certain embodiments, the thermal conducting component 36 does not propagate a signal (e.g., radio frequency signal). In certain embodiments, the thermal conducting component 36 is electrically grounded.

The thermal conducting component 36 may include a heat slug 19 (may also be referred to as a heat spreader), a top heat plate 38A (may also be referred to as a top metal plate layer), and a bottom heat plate 38B (may also be referred to as a bottom metal plate layer). In certain embodiments, the bottom heat plate 38B is a ground plane. Further, in certain embodiments, the bottom ground plane may be divided to smaller segments to reduce package warpage. The heat slug 19 extends through the substrate body 20 from the top surface 22A to the bottom surface 22B of the substrate body 20. The heat slug 19 may be coupled to and retained within the substrate body 12 via adhesive 40. In different applications, the adhesive 40 may be absent and the heat slug 19 may be directly coupled to the substrate body 20. The top heat plate 38A is coupled to the top side of the heat slug 19 and resides over the top surface 22A of the substrate body 20. The bottom heat plate 38B is coupled to the bottom side of the heat slug 19 and resides over the bottom surface 22B of the substrate body 20. The top heat plate 38A and/or the bottom heat plate 38B may be formed of metallic or ceramic materials, such as copper (Cu), copper-tungsten (CuW) and/or Aluminum Nitride (AlN).

The heat slug 19 includes a top layer 42A proximate the top surface 22A of the substrate body 20, a bottom layer 42B proximate the bottom surface 22B of the substrate body 20, and a core layer 44 positioned therebetween. In particular, the top layer 42A has a first thermal conductivity and a first thermal expansion coefficient, the bottom layer 42B has a second thermal conductivity and a second thermal expansion coefficient, and the core layer 44 has a third thermal conductivity and a third thermal expansion coefficient. The third thermal conductivity is less than the first thermal conductivity and the second thermal conductivity, and the third thermal expansion coefficient is less than the first thermal expansion coefficient and the second thermal expansion coefficient.

For example, in certain embodiments, the top layer 42A and/or bottom layer 42B includes copper and is devoid of molybdenum. For copper, the thermal expansion coefficient (CTE) (may also be referred to as a linear temperature expansion coefficient, coefficient of thermal expansion, etc.) is 16-16.7 $10^{-6}$ m/(m °C.) and the thermal conductivity is 413 W/(m K). Comparatively, for molybdenum the CTE is 5 $10^{-6}$ m/(m °C.) and the thermal conductivity is 143 W/(m K). In particular, in certain embodiments, the heat slug 19 uses CPC 141, which has an overall CTE of 8.4 $10^{-6}$ m/(m °C.) and a thermal conductivity of 220 W/(m K). CPC 141 has a Mo70Cu30 core layer and a 1:4:1 thickness ratio.

In certain embodiments, the heat slug 19 includes at least one of copper-molybdenum (CuMo), copper-tungsten (CuW), or aluminum-nitride (AlN). In particular, in certain embodiments, the core layer 44 of the heat slug 19 includes at least one of copper-molybdenum (CuMo), copper-tungsten (CuW), or aluminum-nitride (AlN).

Such a configuration balances and optimizes the thermal conductivity to dissipate heat at the top surface 22A and lower surface 22B while minimizing the expansion of the heat slug 19 and avoiding the stress and warpage associated therewith.

The substrate 12 may further include a mask 47A, 47B to cover at least portions of the routing layers 27 to better control exposure of the routing layers 27A, 27B.

The electronic component 14 (may be referred to as a functional electronic component) is mounted to the top heat plate 38A and/or top layer 42A of the heat slug 19, such as via an adhesive layer 46. The electronic component 14 is mounted to the substrate 12 proximate the top layer 42A of the heat slug 19. In particular, in certain embodiments, the electronic component 14 is mounted to the top metal plate layer 38A proximate the top layer 42A of the heat slug 19, where the electronic component 14 is mounted to the top metal plate layer 38A by epoxy 46.

In certain embodiments, the electronic component 14 includes a power amplifier 48, which includes a transistor 50, where the power amplifier 48 is mounted to a silicon carbide (SiC) substrate 51. In certain embodiments, the power amplifier 48 may be a high-power amplifier that outputs power of at least 50 W (e.g., at least 75 W, at least 100 W, at least 150 W). In certain embodiments, the power amplifier 48 comprises an internal match field-effect transistor 50 (IMFET) gallium-nitride (GaN) power amplifier. In certain embodiments, the transistor 50 is a high-electron-mobility transistor (HEMT).

It is noted that the CTE for CuMo is 8.5 ppm/K, for Cu is 17 ppm/K, and for SiC is 3.1 ppm/K. Accordingly, CuMo provides a closer CTE match to SiC than Cu, thereby avoiding stress and warpage between those components. In other words, in certain embodiments, the CTE of the substrate of the electronic component 14 is within 30% of the CTE of the core layer 44 of the heat slug 19.

The electronic component 14 is configured to propagate signals to other active or passive functional components integrated in the substrate body 20 or external active or passive components. The electronic component 14 may be electrically connected to at least one of the substrate via structures 28, while the thermal conducting component 36 may be electrically isolated from the substrate via structures 28.

As noted above, the lid 16 is attached to the substrate 12 and forms an air cavity 18 between the substrate 12 and the lid 16. In certain embodiments, the thermal expansion coefficient of the lid 16 is within 10% of the thermal expansion coefficient of the substrate 12. For example, in certain embodiments, the lid includes the same material as the substrate 12. In particular, in certain embodiments, the substrate 12 and the lid 16 each comprise a glass-reinforced epoxy laminate material (e.g., FR-4). Doing so reduces and avoids stress between the components as the substrate 12 and the lid 16 expand at the same or similar rates.

In certain embodiments, the substrate 12 has dimensions of about 25 mm×12.5 mm×0.39 mm. In certain embodiments, the lid 16 has a thickness between 2.5 mm and 3.5 mm (e.g., between 2.8 and 3.2 mm, at least 3 mm, etc.) to avoid package warpage. In particular, a lid thickness of 3 mm provides less warpage than a lid having a thickness of 2.4 mm or 2.0 mm. In certain embodiments, the overall laminate package size is about 25 mm×12.5 mm.

Accordingly, the electronic device 10 provides a laminate substrate 12 embedded heat slug 19 with a lid 16 forming an air cavity 18 for high-power, high-performance IMFET transistor power amplifiers using GaN HEMT on SiC technology. Such a configuration provides high performance but is also relatively inexpensive to manufacture and produce. As noted above, GaN HEMT (e.g., on SiC substrate) offers high breakdown voltages, high power density, high efficiency, and high transition frequency. In certain embodiments, IMFET GaN products use lumped components, thin film networks (TFN), single layer caps, and/or passive IC components for impedance match. IMFET products may integrate GaN MMIC die and hybrid matching networks inside the package. IMFET GaN products may provide high power, high efficiency, high integration, and be easy to use. The configuration discussed provides high thermal dissipation to keep the GaN HEMT transistor junction temperature low, thereby preserving the device lifetime and preventing device failure. Compared to a ceramic package with a metallic base, the electronic device 10 disclosed herein provides ease for a user to implement on PCB (e.g., as no PCB cut-out needed), an automated assembly process, and significantly lower cost.

It is noted that in certain embodiments, a large laminate package may be required, but the configuration discussed above avoids package warpage, gross leak failure during assembly, epoxy cracking risk (post temperature cycles), etc.

Figure 2A:
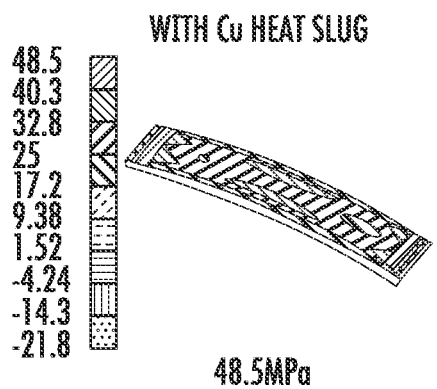
FIG. 2A is a diagram illustrating stress of a copper heat slug.
Figure 2B:
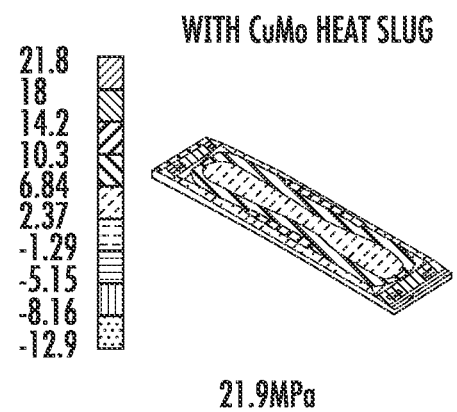
FIG. 2B is a diagram illustrating stress of a copper-molybdenum heat slug.

FIGS. 2A-2B are diagrams illustrating stress of a Cu heat slug compared to a CuMo heat slug. In particular, FIG. 2A is a diagram illustrating stress of a copper heat slug. As illustrated, the Cu heat slug experiences a maximum stress of 48.5 MPa. FIG. 2B is a diagram illustrating stress of a copper-molybdenum heat slug. As illustrated, the CuMo heat slug experiences a maximum stress of 21.9 MPa. Accordingly, the CuMo heat slug experiences significantly less stress compared to the Cu heat slug (e.g., 55% reduction in stress).

Figure 3A:
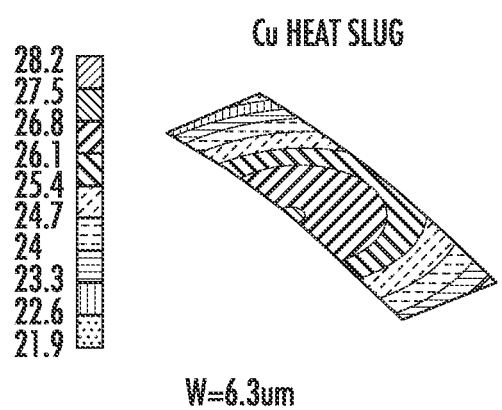
FIG. 3A is a diagram illustrating warpage of a copper heat slug.
Figure 3B:
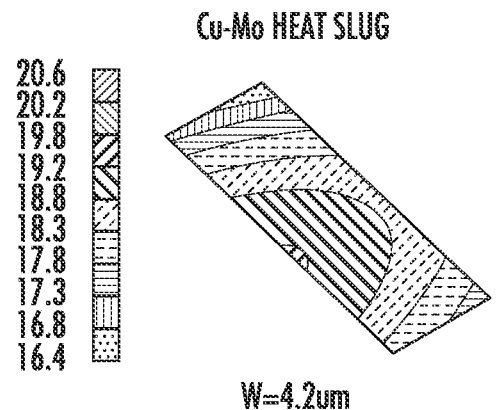
FIG. 3B is a diagram illustrating warpage of a copper-molybdenum heat slug.

FIGS. 3A-3B are diagrams illustrating warpage of a Cu heat slug compared to a CuMo heat slug. In particular, FIG. 3A is a diagram illustrating warpage of a copper heat slug. The Cu heat slug experiences a maximum warpage of 6.3 um. FIG. 3B is a diagram illustrating warpage of a copper-molybdenum heat slug. The CuMo heat slug experiences a maximum warpage of 4.2 um. Accordingly, the CuMo heat slug experiences significantly less warpage compared to the Cu heat slug (e.g., 38% reduction in warpage).

Figure 4A:
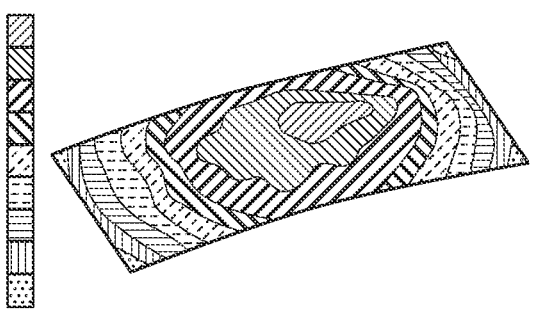
FIG. 4A is a diagram illustrating warpage of a package using a copper heat slug.
Figure 4B:
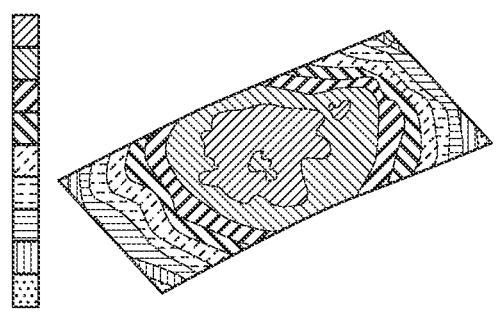
FIG. 4B is a diagram illustrating warpage of a package using a copper-molybdenum heat slug.

FIGS. 4A-4B are diagrams illustrating warpage of a package using a Cu heat slug compared to a CuMo heat slug. In particular, FIG. 4A is a diagram illustrating warpage of a package using a copper heat slug. The package with the Cu heat slug experiences a maximum warpage of 30.5 um. FIG. 4B is a diagram illustrating warpage of a package using a copper-molybdenum heat slug. The package with the CuMo heat slug experiences a maximum warpage of 23.1 um. Accordingly, the package with the CuMo heat slug experiences significantly less warpage compared to the package with the Cu heat slug (e.g., 34.5% reduction in warpage).

Figure 5A:
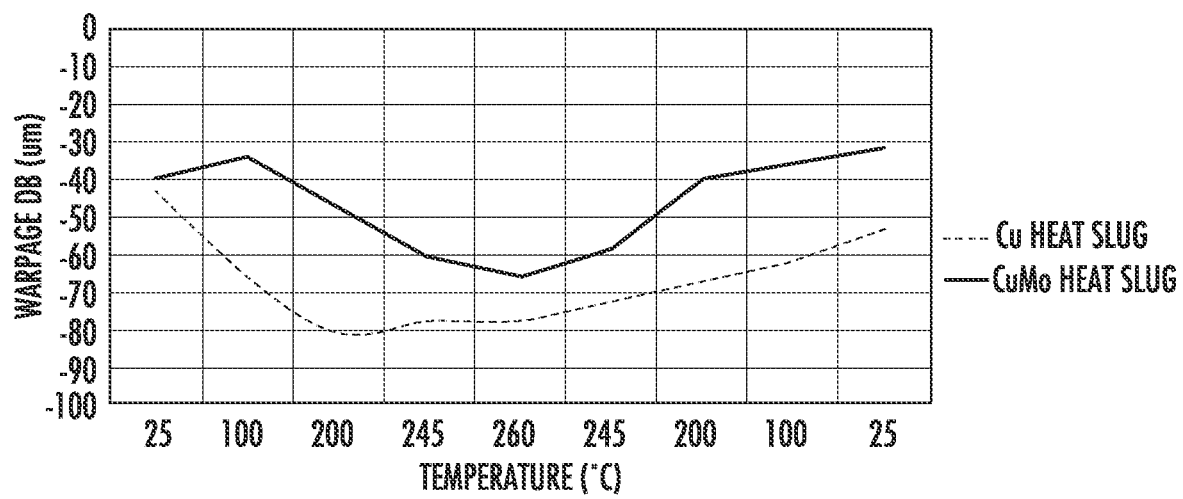
FIG. 5A is a diagram illustrating warpage as a function of temperature of a package with an air cavity using a copper heat slug compared to a copper-molybdenum heat slug.
Figure 5B:
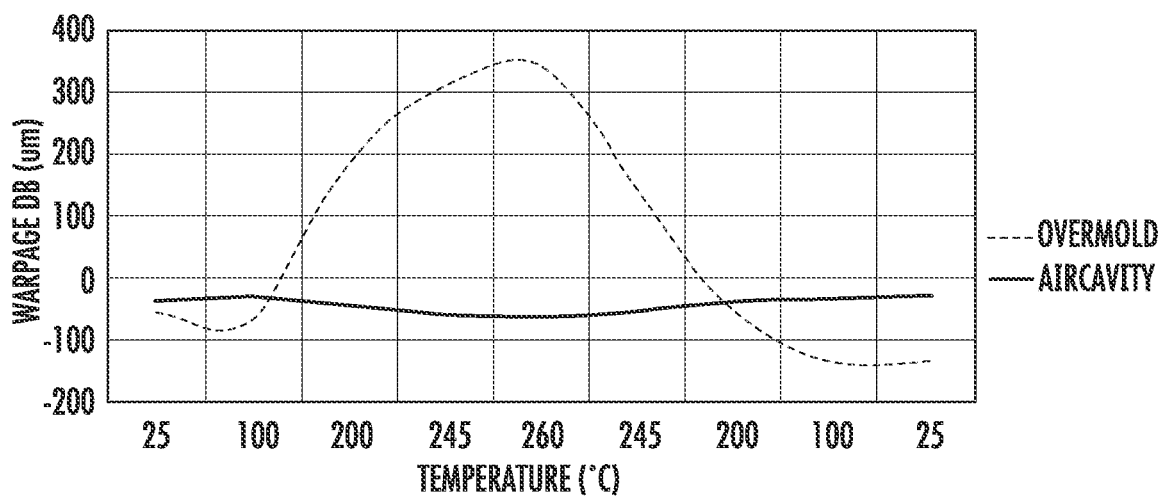
FIG. 5B is a diagram illustrating warpage as a function of temperature of a package with a copper-molybdenum heat slug using an overmold compared to an air cavity.

FIGS. 5A-5B are diagrams illustrating warpage as a function of temperature. In particular, packages were measured using the Joint Electron Device Engineering Counsel (JEDEC) full field signed warpage (JFFS) shadow moire measurements. FIG. 5A is a diagram illustrating warpage as a function of temperature of a package with an air cavity using a copper heat slug compared to a copper-molybdenum heat slug. As illustrated, the package with the CuMo heat slug experiences less warpage across all temperatures compared with the package with the Cu heat slug. FIG. 5B is a diagram illustrating warpage as a function of temperature of a package with a copper-molybdenum heat slug using an overmold compared to an air cavity. As illustrated, the package with the air cavity experiences significantly less warpage as the temperature increases and decreases, especially at the maximum temperature of 260° C. The package with the Cu heat slug experiences over 300 um warpage at 260° C., compared to the package with the CuMo heat slug which experiences −66.2 um warpage at 260° C.

Those skilled in the art will recognize improvements and modifications to the preferred embodiments of the present disclosure. All such improvements and modifications are considered within the scope of the concepts disclosed herein and the claims that follow.

What is claimed is:

1. An electronic device, comprising:
   a substrate comprising:
   a substrate body having a top surface and a bottom surface opposite the top surface, the substrate body comprising a laminate layer;
   a heat slug extending between the top surface and the bottom surface of the substrate body, wherein the heat slug comprises CPC141 having a thickness ratio of 1:4:1, the core layer comprising $Mo_{70}Cu_{30}$ and wherein the heat slug comprises:
   a top layer proximate the top surface of the substrate body, the top layer having a first thermal conductivity and a first thermal expansion coefficient;
   a bottom layer proximate the bottom surface of the substrate body, the bottom layer having a second thermal conductivity and a second thermal expansion coefficient;
   a core layer between the top layer and the bottom layer, the core layer having a third thermal conductivity and a third thermal expansion coefficient, the third thermal conductivity less than the first thermal conductivity and the second thermal conductivity, and the third thermal expansion coefficient less than the first thermal expansion coefficient and the second thermal expansion coefficient; and
   a lid attached to the substrate and forming an air cavity between the substrate and the lid.

2. The electronic device of claim 1, wherein the laminate layer comprises a glass-reinforced epoxy laminate material.

3. The electronic device of claim 1, wherein the substrate body further comprises an upper dielectric layer above the laminate layer and a lower dielectric layer below the laminate layer.

4. The electronic device of claim 1, wherein the heat slug is retained within the substrate body by an adhesive.

5. The electronic device of claim 1, wherein the heat slug comprises at least one of copper-molybdenum (CuMo), copper-tungsten (CuW), or aluminum-nitride (AlN).

6. The electronic device of claim 1, wherein:
   the top layer comprises copper and is devoid of molybdenum;
   the bottom layer comprises copper and is devoid of molybdenum; and the core layer comprises copper and molybdenum.

7. The electronic device of claim 1, further comprising an electronic component mounted to the substrate proximate the top layer of the heat slug.

8. The electronic device of claim 1, further comprising an electronic component mounted to a top metal plate layer proximate the top layer of the heat slug, the electronic component mounted to the top metal plate layer by epoxy.

9. The electronic device of claim 8, wherein the electronic component comprises a power amplifier.

10. The electronic device of claim 9, wherein the power amplifier outputs power of at least 50 W.

11. The electronic device of claim 9, wherein the power amplifier outputs power of at least 100 W.

12. The electronic device of claim 9, wherein the power amplifier comprises an internal match field-effect transistor (IMFET) gallium-nitride (GaN) power amplifier.

13. The electronic device of claim 9, wherein the power amplifier comprises a high-electron-mobility transistor (HEMT).

14. The electronic device of claim 1, wherein a thermal expansion coefficient of the lid is within 10% of a thermal expansion coefficient of the substrate.

15. The electronic device of claim 1, wherein the lid comprises a same material as the substrate.

16. The electronic device of claim 1, wherein the substrate and the lid each comprise a glass-reinforced epoxy laminate material.

17. An electronic device, comprising:
a substrate comprising:
  a substrate body having a top surface and a bottom surface opposite the top surface, the substrate body comprising a laminate layer;
  a heat slug extending between the top surface and the bottom surface of the substrate body, the heat slug comprising:
    a top layer proximate the top surface of the substrate body, the top layer having a first thermal conductivity and a first thermal expansion coefficient;
    a bottom layer proximate the bottom surface of the substrate body, the bottom layer having a second thermal conductivity and a second thermal expansion coefficient;
    a core layer between the top layer and the bottom layer, the core layer having a third thermal conductivity and a third thermal expansion coefficient, the third thermal conductivity less than the first thermal conductivity and the second thermal conductivity, and the third thermal expansion coefficient less than the first thermal expansion coefficient and the second thermal expansion coefficient; and
  a lid attached to the substrate and forming an air cavity between the substrate and the lid, wherein a thermal expansion coefficient of the lid is within 10% of a thermal expansion coefficient of the substrate.

18. An electronic device, comprising:
a substrate comprising:
  a substrate body having a top surface and a bottom surface opposite the top surface, the substrate body comprising a laminate layer;
  a heat slug extending between the top surface and the bottom surface of the substrate body, the heat slug comprising:
    a top layer proximate the top surface of the substrate body, the top layer having a first thermal conductivity and a first thermal expansion coefficient;
    a bottom layer proximate the bottom surface of the substrate body, the bottom layer having a second thermal conductivity and a second thermal expansion coefficient;
    a core layer between the top layer and the bottom layer, the core layer having a third thermal conductivity and a third thermal expansion coefficient, the third thermal conductivity less than the first thermal conductivity and the second thermal conductivity, and the third thermal expansion coefficient less than the first thermal expansion coefficient and the second thermal expansion coefficient; and
  a lid attached to the substrate and forming an air cavity between the substrate and the lid, wherein the substrate and the lid each comprise a glass-reinforced epoxy laminate material.

* * * * *